United States Patent
Yun et al.

(10) Patent No.: US 10,181,863 B2
(45) Date of Patent: Jan. 15, 2019

(54) SEMICONDUCTOR DEVICES AND SEMICONDUCTOR SYSTEMS

(71) Applicant: SK hynix Inc., Icheon-si, Gyeonggi-do (KR)

(72) Inventors: Jae Woong Yun, Seoul (KR); Yong Mi Kim, Hwaseong-si (KR); Chang Hyun Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 2 days.

(21) Appl. No.: 15/429,897

(22) Filed: Feb. 10, 2017

(65) Prior Publication Data

US 2017/0359084 A1    Dec. 14, 2017

(30) Foreign Application Priority Data

Jun. 14, 2016 (KR) .................. 10-2016-0073698

(51) Int. Cl.
*H03M 13/11*    (2006.01)
*G11C 7/22*    (2006.01)
*H03M 13/00*    (2006.01)

(52) U.S. Cl.
CPC ............ *H03M 13/11* (2013.01); *G11C 7/22* (2013.01); *H03M 13/6566* (2013.01)

(58) Field of Classification Search
CPC ..................................................... H03M 13/11
USPC ........................................ 714/758, 762, 760
See application file for complete search history.

(56) References Cited

U.S. PATENT DOCUMENTS

| | | | |
|---|---|---|---|
| 2006/0133166 A1* | 6/2006 | Kikutake ............ | G06F 11/1032 365/201 |
| 2014/0208189 A1 | 7/2014 | Parthasarathy et al. | |
| 2018/0074895 A1* | 3/2018 | Choi ................... | G06F 11/1068 |

FOREIGN PATENT DOCUMENTS

KR    1020140067819 A    6/2014

* cited by examiner

*Primary Examiner* — Fritz Alphonse
(74) *Attorney, Agent, or Firm* — William Park & Associates Ltd.

(57) ABSTRACT

A semiconductor system may be provided. The semiconductor system may include a first semiconductor device and a second semiconductor device. The first semiconductor device may be configured to perform an error correction operation. The second semiconductor device may be configured to perform an error correction operation. The semiconductor system may selectively operate the first or second semiconductor devices with regards to error correction operations based on a mode signal.

18 Claims, 7 Drawing Sheets

SEMICONDUCTOR DEVICES AND SEMICONDUCTOR SYSTEMS

CROSS-REFERENCE TO RELATED APPLICATIONS

The present application claims priority under 35 U.S.C. 119(a) to Korean Patent Application No. 10-2016-0073698, filed on Jun. 14, 2016, which is incorporated herein by reference in its entirety.

BACKGROUND

1. Technical Field

Embodiments of the present disclosure may generally relate to semiconductor devices and semiconductor systems, and more particularly, to a semiconductor device related to the correction of errors in data.

2. Related Art

Recently, a DDR2 scheme or a DDR3 scheme receiving and outputting four bit data or eight bit data during each clock cycle time has been used to improve an operation speed of semiconductor devices. If data transmission speeds of the semiconductor devices become faster, the probability of occurring errors may increase while the semiconductor devices are in operation. Accordingly, novel design schemes have been proposed to improve the reliability of the data transmissions.

Whenever data is transmitted in semiconductor devices, error codes which are capable of detecting an occurrence of the errors may be generated and transmitted with the data to improve the reliability of the data transmissions. The error codes may include an error detection code (EDC) which is capable of detecting errors and an error correction code (ECC) which is capable of correcting the errors by itself.

SUMMARY

According to an embodiment, a semiconductor device may be provided. According to an embodiment, a semiconductor system may be provided. The semiconductor system may include a first semiconductor device and a second semiconductor device. The first semiconductor device may be configured to perform an error correction operation. The second semiconductor device may be configured to perform an error correction operation. The semiconductor system may selectively operate the first or second semiconductor devices with regards to error correction operations based on a mode signal.

According to another embodiment, a semiconductor device may be provided. The semiconductor system may include an input/output (input and output) (I/O) buffer circuit and an error correction control circuit. The I/O buffer circuit may be configured to buffer a transmission data signal to generate an internal data signal and configured to buffer a transmission parity signal to generate an internal parity signal based on a mode signal. The error correction control circuit may be configured to generate the internal parity signal for correcting an error of the transmission data signal based on the mode signal.

According to still another embodiment, a semiconductor system may be provided. The semiconductor system may include a first semiconductor device and a second semiconductor device. The first semiconductor device may be configured to generate a transmission parity signal for correcting an error of a transmission data signal and configured to output the transmission data signal and the transmission parity signal. The second semiconductor device may be configured to buffer the transmission data signal and the transmission parity signal to generate an internal data signal and a first internal parity signal during a write operation and configured to generate a second internal parity signal for correcting errors of the transmission data signal and the transmission parity signal during the write operation. The second semiconductor device may be configured to include a data storage area configured to store the internal data signal, a first parity storage area configured to store the first internal parity signal, and a second parity storage area configured to store the second internal parity signal.

According to still another embodiment, a semiconductor system may be provided. The semiconductor system may include a first semiconductor device and a second semiconductor device. The first semiconductor device may include a host error correction control circuit and be configured to perform an error correction operation. The second semiconductor device may include an error correction control circuit and be configured to perform an error correction operation, wherein the semiconductor system selectively operates either the host error correction control circuit or the error correction control circuit based on a mode signal.

If the mode signal is enabled, then the operation of the error correction control circuit is terminated. If the mode signal is disabled, then the operation of the host error correction control circuit is terminated.

The host error correction control circuit is configured to generate a transmission parity signal during a write operation and correct an error of a transmission data signal during a read operation. The error correction control circuit is configured to generate an internal parity signal during the write operation and correct the error of the transmission data signal during the read operation.

The error correction control circuit is configured to generate an internal parity signal for correcting an error of a transmission data signal based on the mode signal.

The second semiconductor device includes an input/output (input and output) (I/O) buffer circuit configured to buffer the transmission data signal to generate an internal data signal and configured to buffer a transmission parity signal to generate the internal parity signal based on the mode signal.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices selecting positions in which errors of data may be corrected and semiconductor systems including the semiconductor devices.

Figure 1:
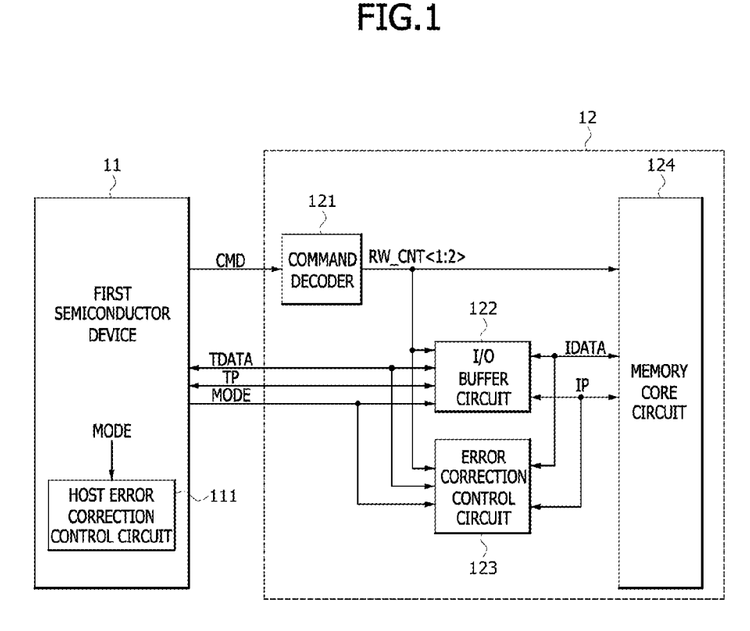
FIG. 1 is a block diagram illustrating a representation of an example of a configuration of a semiconductor system according to an embodiment of the present disclosure.

Referring to FIG. 1, a semiconductor system according to an embodiment of the present disclosure may include a first semiconductor device 11 and a second semiconductor device 12.

The first semiconductor device 11 may include a host error correction control circuit 111. The first semiconductor device 11 may output a command signal CMD and a mode signal MODE and may receive or output a transmission data signal TDATA and a transmission parity signal TP. The first semiconductor device 11 may output the command signal CMD, the transmission data signal TDATA, the transmission parity signal TP, and the mode signal MODE during a write operation of the second semiconductor device 12. The transmission parity signal TP may be generated by the host error correction control circuit 111 to correct an error of the transmission data signal TDATA. The transmission parity signal TP may be generated if the mode signal MODE is enabled and may not be generated if the mode signal MODE is disabled. The mode signal MODE may be generated by the first semiconductor device 11 or the second semiconductor device 12. The mode signal MODE may be transmitted through a transmission line that transmits the command signal CMD. Each of the signals, the command signal CMD, the transmission data signal TDATA, and the transmission parity signal TP may include multiple bits. The first semiconductor device 11 may receive the transmission data signal TDATA and the transmission parity signal TP if a read operation of the second semiconductor device 12 is performed. The first semiconductor device 11 may correct an error of the transmission data signal TDATA in response to the transmission parity signal TP, if the mode signal MODE is enabled. The host error correction control circuit 111 may generate the transmission parity signal TP for correcting an error of the transmission data signal TDATA in response to the mode signal MODE or may correct the error of the transmission data signal TDATA in response to the transmission parity signal TP. The host error correction control circuit 111 may generate the transmission parity signal TP for correcting the error of the transmission data signal TDATA, if the mode signal MODE is enabled during the write operation. The host error correction control circuit 111 may generate the transmission parity signal TP from the transmission data signal TDATA, using a using a Hamming code realization scheme. The host error correction control circuit 111 may correct the error of the transmission data signal TDATA in response to the transmission parity signal TP, if the mode signal MODE is enabled during the read operation. An operation of the host error correction control circuit 111 may terminate if the mode signal MODE is disabled.

The second semiconductor device 12 may include a command decoder 121, an input/output (Input and output) (I/O) buffer circuit 122, an error correction control circuit 123, and a memory core circuit 124.

The command decoder 121 may decode the command signal CMD to generate first and second read/write (read and write) control signals RW_CNT<1:2>. The command decoder 121 may decode the command signal CMD to generate the first read/write control signal RW_CNT<1> which is enabled during the write operation. The command decoder 121 may decode the command signal CMD to generate the second read/write control signal RW_CNT<2> which is enabled during the read operation.

The I/O buffer circuit 122 may buffer the transmission data signal TDATA and the transmission parity signal TP to output the buffered signals as an internal data signal IDATA and an internal parity signal IP or may buffer the internal data signal IDATA and the internal parity signal IP to generate the transmission data signal TDATA and the transmission parity signal TP, in response to the first and second read/write control signals RW_CNT<1:2> and the mode signal MODE. In some embodiments, the mode signal MODE may be generated by the second semiconductor device 12. If the first read/write control signal RW_CNT<1> is enabled to perform the write operation while the mode signal MODE is enabled, the I/O buffer circuit 122 may buffer the transmission data signal TDATA and the transmission parity signal TP to output the buffered signals as the internal data signal IDATA and the internal parity signal IP. If the second read/write control signal RW_CNT<2> is enabled to perform the read operation while the mode signal MODE is enabled, the I/O buffer circuit 122 may buffer the internal data signal IDATA and the internal parity signal IP to output the buffered signals as the transmission data signal TDATA and the transmission parity signal TP. If the first read/write control signal RW_CNT<1> is enabled to perform the write operation while the mode signal MODE is disabled, the I/O buffer circuit 122 may buffer the transmission data signal TDATA to output the buffered signal as the internal data signal IDATA. If the second read/write control signal RW_CNT<2> is enabled to perform the read operation while the mode signal MODE is disabled, the I/O buffer circuit 122 may buffer the internal data signal IDATA to output the buffered signal as the transmission data signal TDATA. If the mode signal MODE is disabled, the I/O buffer circuit 122 may terminate the I/O operations of the transmission parity signal TP and the internal parity signal IP.

The error correction control circuit 123 may generate the internal parity signal IP for correcting an error of the transmission data signal TDATA in response to the first and second read/write control signals RW_CNT<1:2> and the mode signal MODE or may correct an error of the internal data signal IDATA to generate the transmission data signal TDATA in response to the internal parity signal IP. If the first read/write control signal RW_CNT<1> is enabled to perform the write operation while the mode signal MODE is disabled, the error correction control circuit 123 may generate the internal parity signal IP for correcting an error of the transmission data signal TDATA. The error correction control circuit 123 may generate the internal parity signal IP from the transmission data signal TDATA, using a Hamming code realization scheme. If the second read/write control signal RW_CNT<2> is enabled to perform the read operation while the mode signal MODE is disabled, the error correction control circuit 123 may correct an error of the internal data signal IDATA to generate the transmission data signal TDATA in response to the internal parity signal IP. If the mode signal MODE is enabled, an operation of the error correction control circuit 123 may terminate.

The memory core circuit 124 may store the internal data signal IDATA and the internal parity signal IP therein or may output the internal data signal IDATA and the internal parity signal IP, in response to the first and second read/write control signals RW_CNT<1:2>. If the first read/write control signal RW_CNT<1> is enabled to perform the write operation, the memory core circuit 124 may store the internal data signal IDATA and the internal parity signal IP. If the second read/write control signal RW_CNT<2> is enabled to perform the read operation, the memory core circuit 124 may output the internal data signal IDATA and the internal parity signal IP.

Figure 2:
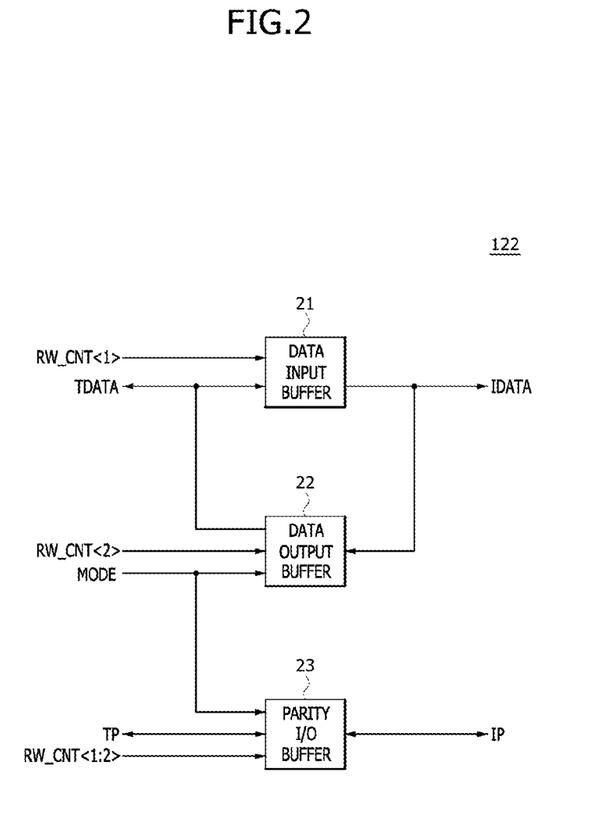
FIG. 2 is a block diagram illustrating a representation of an example of an input/output buffer circuit included in the semiconductor system of FIG. 1.

Referring to FIG. 2, the I/O buffer circuit 122 may include a data input buffer 21, a data output buffer 22, and a parity I/O buffer 23.

The data input buffer 21 may buffer the transmission data signal TDATA to output the buffered signal as the internal data signal IDATA in response to the first read/write control signal RW_CNT<1>. If the first read/write control signal RW_CNT<1> is enabled to perform the write operation, the data input buffer 21 may buffer the transmission data signal TDATA to output the buffered signal as the internal data signal IDATA.

The data output buffer 22 may buffer the internal data signal IDATA to generate the transmission data signal TDATA in response to the second read/write control signal RW_CNT<2> and the mode signal MODE. If the second read/write control signal RW_CNT<2> is enabled to perform the read operation while the mode signal MODE is enabled, the data output buffer 22 may buffer the internal data signal IDATA to output the buffered signal as the transmission data signal TDATA. If the mode signal MODE is disabled, an operation of the data output buffer 22 may terminate.

The parity I/O buffer 23 may buffer the transmission parity signal TP to generate the internal parity signal IP or may buffer the internal parity signal IP to generate the transmission parity signal TP, in response to the first and second read/write control signals RW_CNT<1:2> and the mode signal MODE. If the first read/write control signal RW_CNT<1> is enabled to perform the write operation while the mode signal MODE is enabled, the parity I/O buffer 23 may buffer the transmission parity signal TP to generate the internal parity signal IP. If the second read/write control signal RW_CNT<2> is enabled to perform the read operation while the mode signal MODE is enabled, the parity I/O buffer 23 may buffer the internal parity signal IP to generate the transmission parity signal TP. If the mode signal MODE is disabled, an operation of the parity I/O buffer 23 may terminate.

Figure 3:
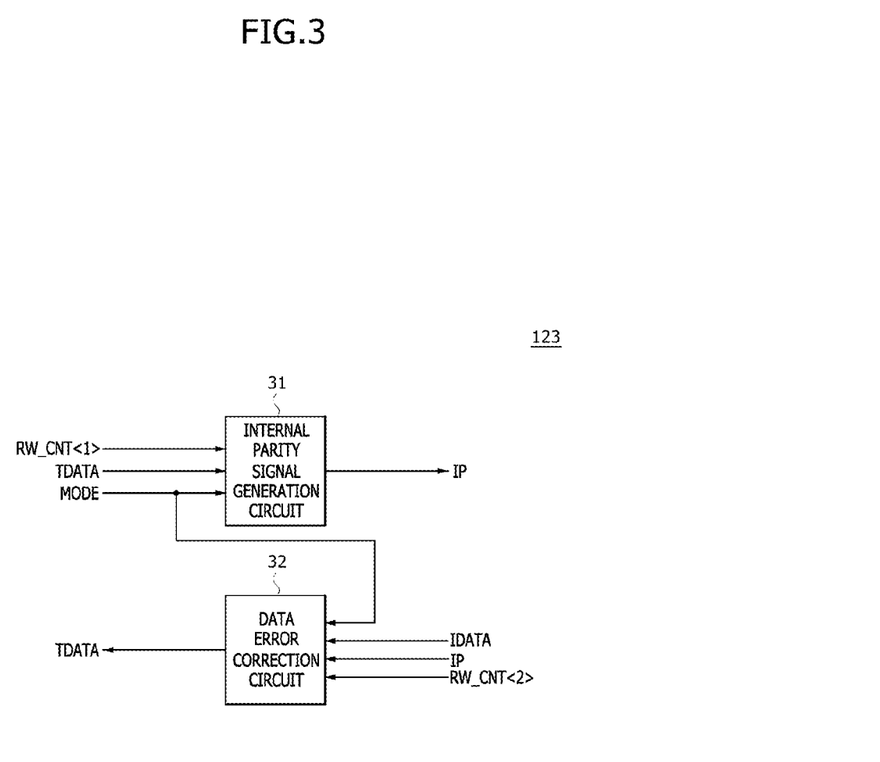
FIG. 3 is a block diagram illustrating a representation of an example of an error correction control circuit included in the semiconductor system of FIG. 1.

Referring to FIG. 3, the error correction control circuit 123 may include an internal parity signal generation circuit 31 and a data error correction circuit 32.

The internal parity signal generation circuit 31 may generate the internal parity signal IP for correcting the error of the transmission data signal TDATA in response to the first read/write control signal RW_CNT<1> and the mode signal MODE. The internal parity signal generation circuit 31 may generate the internal parity signal IP from the transmission data signal TDATA, using a Hamming code realization scheme. If the first read/write control signal RW_CNT<1> is enabled to perform the write operation while the mode signal MODE is disabled, the internal parity signal generation circuit 31 may generate the internal parity signal IP for correcting the error of the transmission data signal TDATA. If the mode signal MODE is enabled, an operation of the internal parity signal generation circuit 31 may terminate.

The data error correction circuit 32 may correct an error of the internal data signal IDATA to output the corrected signal as the transmission data signal TDATA according to the internal parity signal IP in response to the second read/write control signal RW_CNT<2> and the mode signal MODE. If the second read/write control signal RW_CNT<2> is enabled to perform the read operation while the mode signal MODE is disabled, the data error correction circuit 32 may correct the error of the internal data signal IDATA to output the corrected signal as the transmission data signal TDATA in response to the internal parity signal IP. If the mode signal MODE is enabled, an operation of the data error correction circuit 32 may terminate.

Figure 4:
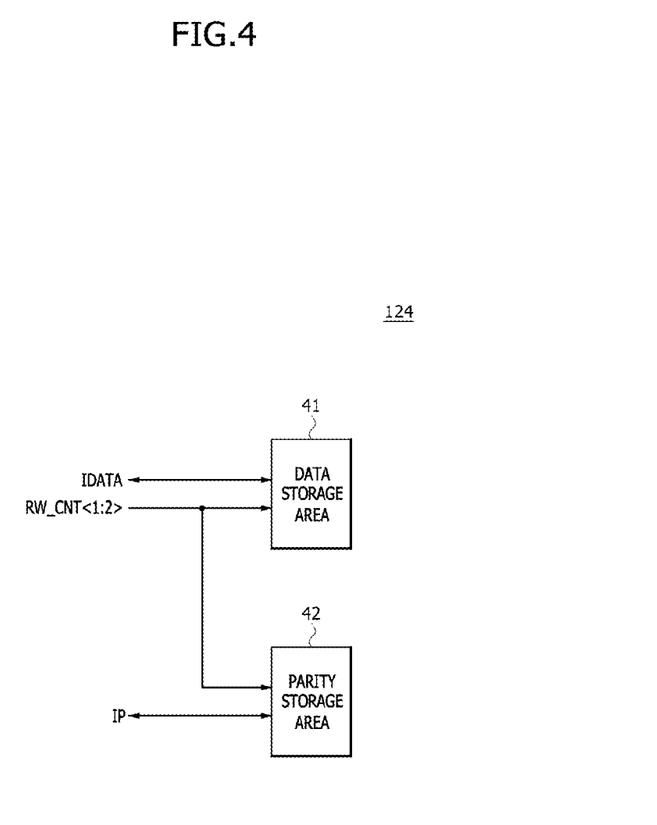
FIG. 4 is a block diagram illustrating a representation of an example of a memory core circuit included in the semiconductor system of FIG. 1.

Referring to FIG. 4, the memory core circuit 124 may include a data storage area 41 and a parity storage area 42.

The internal data signal IDATA may be stored in or may be outputted from the data storage area 41 in response to the first and second read/write control signals RW_CNT<1:2>. If the first read/write control signal RW_CNT<1> is enabled to perform the write operation, the internal data signal IDATA may be stored in the data storage area 41. If the second read/write control signal RW_CNT<2> is enabled to perform the read operation, the internal data signal IDATA may be outputted from the data storage area 41.

The internal parity signal IP may be stored in or may be outputted from the parity storage area 42 in response to the first and second read/write control signals RW_CNT<1:2>. If the first read/write control signal RW_CNT<1> is enabled to perform the write operation, the internal parity signal IP may be stored in the parity storage area 42. If the second read/write control signal RW_CNT<2> is enabled to perform the read operation, the internal parity signal IP may be outputted from the parity storage area 42.

A semiconductor system according to an present embodiment may selectively use the host error correction control circuit 111 included in the first semiconductor device 11 or the error correction control circuit 123 included in the second semiconductor device 12, according to the mode signal MODE. If the mode signal MODE is enabled, the host error correction control circuit 111 included in the first semiconductor device 11 may be used. If the mode signal MODE is enabled, the host error correction control circuit 111 may generate the transmission parity signal TP during the write operation and may correct an error of the transmission data signal TDATA during the read operation. In such a case, an operation of the error correction control circuit 123 included in the second semiconductor device 12 may terminate. If the mode signal MODE is disabled, the error correction control circuit 123 included in the second semiconductor device 12 may be used. If the mode signal MODE is disabled, the error correction control circuit 123 may generate the internal parity signal IP during the write operation and may correct the error of the transmission data signal TDATA to output the corrected signal during the read operation. In such a case, an operation of the host error correction control circuit 111 included in the first semiconductor device 11 may terminate. As such, if the first semiconductor device 11 performs the error correction operation, the second semiconductor device 12 may not perform the error correction operation. Thus, the write operation and the read operation may be quickly performed.

Figure 5:
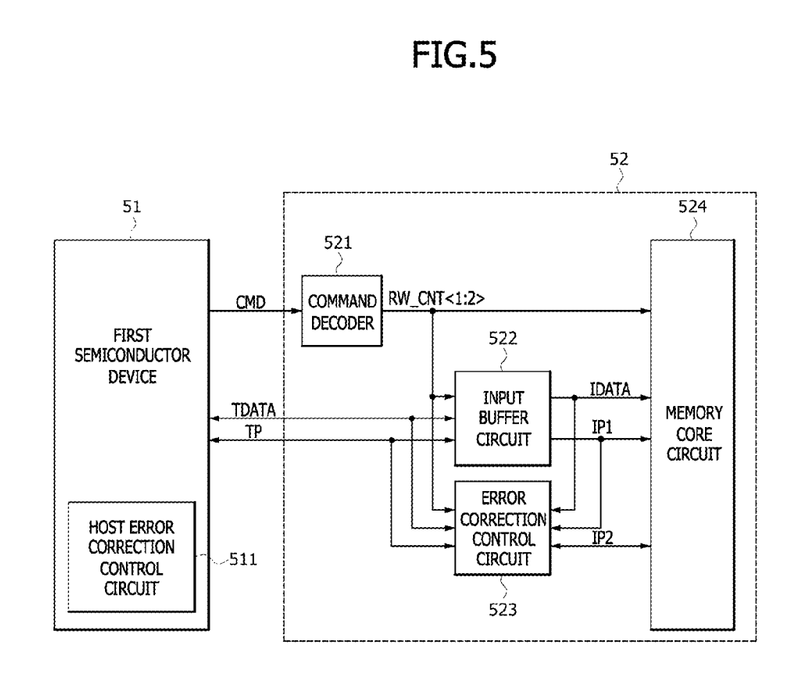
FIG. 5 is a block diagram illustrating a representation of an example of a configuration of a semiconductor system according to an embodiment of the present disclosure.

Referring to FIG. 5, a semiconductor system according to an embodiment may include a first semiconductor device 51 and a second semiconductor device 52.

The first semiconductor device 51 may include a host error correction control circuit 511. The first semiconductor device 51 may output a command signal CMD and may receive or output a transmission data signal TDATA and a transmission parity signal TP. The first semiconductor device 51 may output the command signal CMD, the transmission data signal TDATA, and the transmission parity signal TP during a write operation of the second semiconductor device 52. The transmission parity signal TP may be generated by the host error correction control circuit 511 to correct an error of the transmission data signal TDATA. Each of the signals, the command signal CMD, the transmission data signal TDATA, and the transmission parity signal TP may include multiple bits. The first semiconductor device 51 may receive the transmission data signal TDATA and the transmission parity signal TP if a read operation of the second semiconductor device 52 is performed. The first semiconductor device 51 may correct an error of the transmission data signal TDATA using the host error correction control circuit 511 in response to the transmission parity signal TP.

The second semiconductor device 52 may include a command decoder 521, an input buffer circuit 522, an error correction control circuit 523, and a memory core circuit 524.

The command decoder 521 may decode the command signal CMD to generate first and second read/write control signals RW_CNT<1:2>. The command decoder 521 may decode the command signal CMD to generate the first read/write control signal RW_CNT<1> which is enabled during the write operation. The command decoder 521 may decode the command signal CMD to generate the second read/write control signal RW_CNT<2> which is enabled during the read operation.

The input buffer circuit 522 may buffer the transmission data signal TDATA and the transmission parity signal TP to generate an internal data signal IDATA and a first internal parity signal IP1 in response to the first read/write control signal RW_CNT<1>. If the first read/write control signal RW_CNT<1> is enabled to perform the write operation, the input buffer circuit 522 may buffer the transmission data signal TDATA and the transmission parity signal TP to generate the internal data signal IDATA and the first internal parity signal IP1.

The error correction control circuit 523 may generate a second internal parity signal IP2 for correcting errors of the transmission data signal TDATA and the transmission parity signal TP in response to the first and second read/write control signals RW_CNT<1:2> or may correct errors of the internal data signal IDATA and the first internal parity signal IP1 to generate the transmission data signal TDATA and the transmission parity signal TP in response to the second internal parity signal IP2.

If the first read/write control signal RW_CNT<1> is enabled to perform the write operation, the error correction control circuit 523 may generate the second internal parity signal IP2 for correcting the errors of the transmission data signal TDATA and the transmission parity signal TP. The error correction control circuit 523 may generate the second internal parity signal IP2 from the transmission data signal TDATA and the transmission parity signal TP, using a Hamming code realization scheme. If the second read/write control signal RW_CNT<2> is enabled to perform the read operation, the error correction control circuit 523 may correct an error of the internal data signal IDATA and the first internal parity signal IP1 to generate the transmission data signal TDATA and the transmission parity signal TP in response to the second internal parity signal IP2.

The memory core circuit 524 may store the internal data signal IDATA, the first internal parity signal IP1, and the second internal parity signal IP2 therein or may output the internal data signal IDATA, the first internal parity signal IP1, and the second internal parity signal IP2, in response to the first and second read/write control signals RW_CNT<1:2>. If the first read/write control signal RW_CNT<1> is enabled to perform the write operation, the memory core circuit 524 may store the internal data signal IDATA, the first internal parity signal IP1, and the second internal parity signal IP2 therein. If the second read/write control signal RW_CNT<2> is enabled to perform the read operation, the memory core circuit 524 may output the internal data signal IDATA, the first internal parity signal IP1, and the second internal parity signal IP2.

Figure 6:
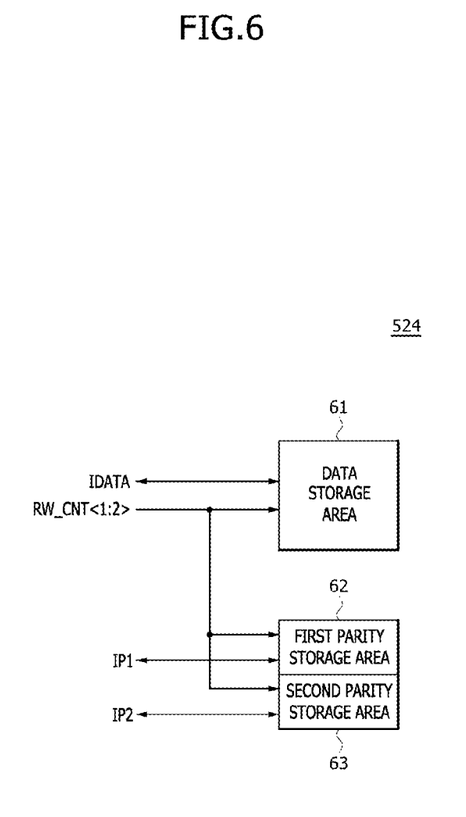
FIG. 6 is a block diagram illustrating a representation of an example of a memory core circuit included in the semiconductor system of FIG. 5.

Referring to FIG. 6, the memory core circuit 524 may include a data storage area 61, a first parity storage area 62, and a second parity storage area 63.

The internal data signal IDATA may be stored in or may be outputted from the data storage area 61 in response to the first and second read/write control signals RW_CNT<1:2>. If the first read/write control signal RW_CNT<1> is enabled to perform the write operation, the internal data signal IDATA may be stored in the data storage area 61. If the second read/write control signal RW_CNT<2> is enabled to perform the read operation, the internal data signal IDATA may be outputted from the data storage area 61.

The first internal parity signal IP1 may be stored in or may be outputted from the first parity storage area 62 in response to the first and second read/write control signals RW_CNT<1:2>. If the first read/write control signal RW_CNT<1> is enabled to perform the write operation, the first internal parity signal IP1 may be stored in the first parity storage area 62. If the second read/write control signal RW_CNT<2> is enabled to perform the read operation, the first internal parity signal IP1 may be outputted from the first parity storage area 62.

The second internal parity signal IP2 may be stored in or may be outputted from the second parity storage area 63 in response to the first and second read/write control signals RW_CNT<1:2>. If the first read/write control signal RW_CNT<1> is enabled to perform the write operation, the second internal parity signal IP2 may be stored in the second parity storage area 63. If the second read/write control signal RW_CNT<2> is enabled to perform the read operation, the second internal parity signal IP2 may be outputted from the second parity storage area 63.

A semiconductor system illustrated in FIG. 5 and FIG. 6 may simultaneously use the host error correction control circuit 511 included in the first semiconductor device 51 and the error correction control circuit 523 included in the second semiconductor device 52. If the host error correction control circuit 511 and the error correction control circuit 523 are simultaneously used, the host error correction control circuit 511 may generate the transmission parity signal TP for correcting the error of the transmission data signal TDATA and the error correction control circuit 523 may generate the second internal parity signal IP2 for correcting the errors of the transmission data signal TDATA and the transmission parity signal TP, during the write operation. During the write operation, the transmission data signal TDATA and the transmission parity signal TP may be buffered to generate the internal data signal IDATA and the first internal parity signal IP1 and the internal data signal IDATA, the first internal parity signal IP1 and the second internal parity signal IP2 may be stored in the memory core circuit 524. If the host error correction control circuit 511 and the error correction control circuit 523 are simultaneously used, the memory core circuit 524 may output the internal data signal IDATA, the first internal parity signal IP1 and the second internal parity signal IP2, the error correction control circuit 523 may correct the error of the internal data signal IDATA and the first internal parity signal IP1 to generate the transmission data signal TDATA and the transmission parity signal TP in response to the second internal parity signal IP2, and the host error correction control circuit 511 may correct the error of the transmission data signal TDATA once more in response to the transmission parity signal TP, during the read operation. That is, the semiconductor system illustrated in FIG. 5 and FIG. 6 may correct the error twice to reduce an occurrence rate of the error.

Figure 7:
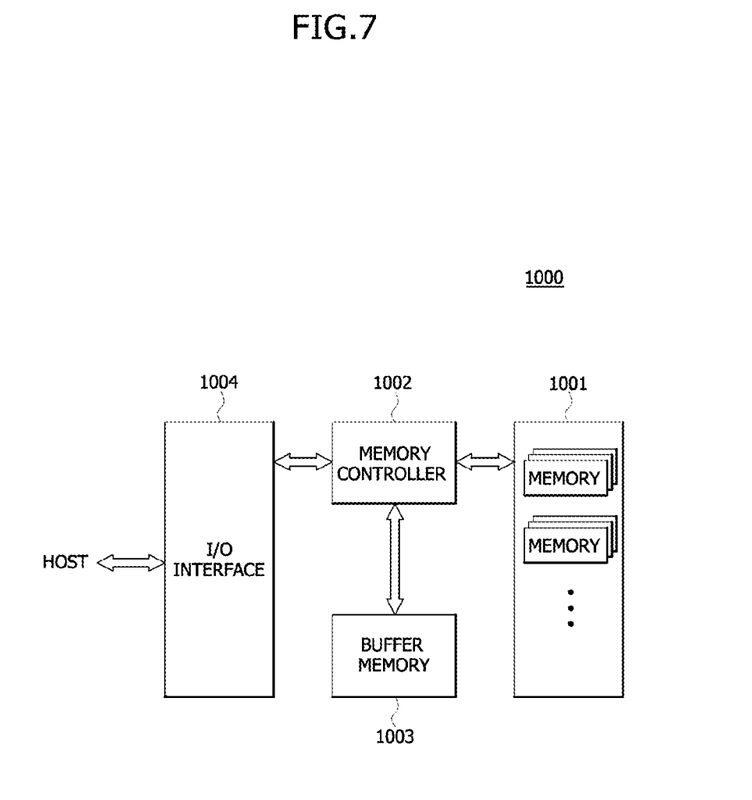
FIG. 7 is a block diagram illustrating a representation of an example of a configuration of an electronic system employing at least one of the semiconductor systems illustrated in FIG. 1 to FIG. 6.

At least one of the semiconductor systems described with reference to FIGS. 1 to 6 may be applied to an electronic system that includes a memory system, a graphic system, a computing system, a mobile system, or the like. For example, as illustrated in FIG. 7, an electronic system 1000 according an embodiment may include a data storage circuit 1001, a memory controller 1002, a buffer memory 1003, and an input/output (input and output) (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include a second semiconductor device 12 illustrated in FIG. 1 or a second semiconductor device 52 illustrated in FIG. 5. The data storage circuit 1001 may include a nonvolatile memory that can retain their stored data even if its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include a first semiconductor device 11 illustrated in FIG. 1 or a first semiconductor device 51 illustrated in FIG. 5. Although FIG. 7 illustrates the memory controller 1002 with a single block, the memory controller 1002 may include one controller for controlling a nonvolatile memory 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE), etc.

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

According to the present disclosure, an operation of correcting errors of data may be performed in any one of a controller and a memory device to improve a speed of the write operation and the read operation of the memory device.

According to the present disclosure, both of the controller and the memory device may correct the error of the data to reduce an occurrence rate of an error.

What is claimed is:

1. A semiconductor system comprising:
   a first semiconductor device including a host error correction control circuit and the first semiconductor device configured to output a command signal, a transmission data signal and a transmission parity signal; and
   a second semiconductor device configured to receive the command signal, transmission data signal, and transmission parity signal from the first semiconductor device, configured to buffer the transmission data signal to generate an internal data signal based on the command signal during a write operation, and configured to generate an internal parity signal by buffering the transmission parity signal or to generate the internal parity signal for correcting an error of the transmission data signal based on a mode signal,
   wherein when the mode signal is enabled during the write operation, the host error correction control circuit generates the transmission parity signal for correcting the error of the transmission data signal.

2. The system of claim 1, wherein the second semiconductor device buffers the transmission parity signal to generate the internal parity signal when the mode signal is enabled and generates the internal parity signal for correcting the error of the transmission data signal when the mode signal is disabled, during the write operation.

3. The system of claim 1, wherein when the mode signal is enabled during a read operation, the second semiconductor device buffers the internal data signal and the internal parity signal to output the buffered signals as the transmission data signal and the transmission parity signal.

4. The system of claim 1, wherein when the mode signal is disabled during a read operation, the second semiconductor device corrects an error of the internal data signal to output the corrected signal as the transmission data signal in response to the internal parity signal.

5. The system of claim 1, wherein the second semiconductor device includes:
an input/output (input and output) (I/O) buffer circuit configured to buffer the transmission data signal and the transmission parity signal to generate the internal data signal and the internal parity signal, when the mode signal is enabled;
an error correction control circuit configured to generate the internal parity signal for correcting the error of the transmission data signal during the write operation and configured to correct an error of the internal data signal to output the corrected signal as the transmission data signal based on the internal parity signal during a read operation, when the mode signal is disabled; and
a memory core circuit configured to store the internal data signal and the internal parity signal.

6. The system of claim 5,
wherein the memory core circuit includes a data storage area and a parity storage area;
wherein the data storage area stores or outputs the internal data signal; and
wherein the parity storage area stores or outputs the internal parity signal.

7. The system of claim 5, wherein the I/O buffer circuit includes:
a data input buffer configured to buffer the transmission data signal to output the buffered signal as the internal data signal during the write operation;
a data output buffer configured to buffer the internal data signal to output the buffered signal as the transmission data signal based on the mode signal during the read operation; and
a parity I/O buffer configured to buffer the transmission parity signal to output the buffered signal as the internal parity signal during the write operation and configured to buffer the internal parity signal to output the buffered signal as the transmission parity signal during the read operation, based on the mode signal.

8. The system of claim 5, wherein the error correction control circuit includes:
an internal parity signal generation circuit configured to generate the internal parity signal for correcting the error of the transmission data signal based on the mode signal during the write operation; and
a data error correction circuit configured to correct the error of the internal data signal to output the corrected signal as the transmission data signal according to the internal parity signal, based on the mode signal during the read operation.

9. A semiconductor device comprising:
an input/output (input and output) (I/O) buffer circuit configured to buffer a transmission data signal to generate an internal data signal and configured to buffer a transmission parity signal to generate an internal parity signal based on a mode signal; and
an error correction control circuit configured to generate the internal parity signal for correcting an error of the transmission data signal based on the mode signal,
wherein when the mode signal is enabled during a write operation, the I/O buffer circuit buffers the transmission parity signal to generate the internal parity signal.

10. The device of claim 9, wherein when the mode signal is disabled during a write operation, the error correction control circuit generates the internal parity signal.

11. The device of claim 9, wherein when the mode signal is enabled during a read operation, the I/O buffer circuit buffers the internal data signal and the internal parity signal to output the buffered signals as the transmission data signal and the transmission parity signal.

12. The device of claim 9, wherein when the mode signal is disabled during a read operation, the error correction control circuit corrects an error of the internal data signal to generate the transmission data signal based on the internal parity signal.

13. The device of claim 9, wherein the I/O buffer circuit includes:
a data input buffer configured to buffer the transmission data signal to output the buffered signal as the internal data signal during a write operation;
a data output buffer configured to buffer the internal data signal to output the buffered signal as the transmission data signal based on the mode signal during a read operation; and
a parity I/O buffer configured to buffer the transmission parity signal to output the buffered signal as the internal parity signal during the write operation and configured to buffer the internal parity signal to output the buffered signal as the transmission parity signal during the read operation, based on the mode signal.

14. The device of claim 9, wherein the error correction control circuit includes:
an internal parity signal generation circuit configured to generate the internal parity signal for correcting the error of the transmission data signal based on the mode signal during a write operation; and
a data error correction circuit configured to correct the error of the internal data signal to output the corrected signal as the transmission data signal according to the internal parity signal, based on the mode signal during a read operation.

15. A semiconductor system comprising:
a first semiconductor device configured to generate a transmission parity signal for correcting an error of a transmission data signal and configured to output the transmission data signal and the transmission parity signal; and
a second semiconductor device configured to buffer the transmission data signal and the transmission parity signal to generate an internal data signal and a first internal parity signal during a write operation and configured to generate a second internal parity signal for correcting errors of the transmission data signal and the transmission parity signal during the write operation when a mode signal is enabled,
wherein the second semiconductor device includes:
a data storage area configured to store the internal data signal;
a first parity storage area configured to store the first internal parity signal; and
a second parity storage area configured to store the second internal parity signal.

16. The system of claim 15, wherein the second semiconductor device corrects errors of the internal data signal and the first internal parity signal to generate the transmission data signal and the transmission parity signal, based on the second internal parity signal during a read operation.

17. The system of claim 15, wherein the first semiconductor device corrects an error of the transmission data signal based on the transmission parity signal during a read operation.

18. The system of claim 15, wherein the second semiconductor device includes:
- an input buffer circuit configured to buffer the transmission data signal and the transmission parity signal to generate the internal data signal and the first internal parity signal;
- an error correction control circuit configured to generate a second internal parity signal for correcting errors of the transmission data signal and the transmission parity signal during the write operation and configured to correct errors of the internal data signal and the first internal parity signal to generate the transmission data signal and the transmission parity signal based on the second internal parity signal during a read operation; and
- a memory core circuit configured to include the data storage area, the first parity storage area and the second parity storage area and configured to store or output the internal data signal, the first internal parity signal and the second internal parity signal.

* * * * *